(12) United States Patent
Park et al.

(10) Patent No.: US 7,853,840 B2
(45) Date of Patent: Dec. 14, 2010

(54) SEMICONDUCTOR MEMORY DEVICE AND METHODS THEREOF

(75) Inventors: Min-Sang Park, Yongin-si (KR); Jeong-Don Lim, Seongnam-si (KR); Youn-Sik Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 706 days.

(21) Appl. No.: 11/702,569

(22) Filed: Feb. 6, 2007

(65) Prior Publication Data

US 2008/0094932 A1    Apr. 24, 2008

(30) Foreign Application Priority Data

Jul. 7, 2006   (KR)   .................. 10-2006-0063779

(51) Int. Cl.
G11C 29/00 (2006.01)
G01R 31/28 (2006.01)
G01R 31/26 (2006.01)
G06F 17/50 (2006.01)

(52) U.S. Cl. ............... 714/718; 714/724; 324/765; 365/201; 716/4

(58) Field of Classification Search ............... 714/718, 714/724; 716/4; 365/201; 324/765
See application file for complete search history.

(56) References Cited

U.S. PATENT DOCUMENTS

| | | | | | |
|---|---|---|---|---|---|
| 4,672,583 | A | * | 6/1987 | Nakaizumi | ............... 365/222 |
| 5,812,562 | A | * | 9/1998 | Baeg | ............... 714/726 |
| 6,065,143 | A | * | 5/2000 | Yamasaki et al. | ............ 714/720 |
| 6,163,491 | A | | 12/2000 | Iwamoto et al. | |
| 6,189,119 | B1 | | 2/2001 | Kitaoka et al. | |

(Continued)

FOREIGN PATENT DOCUMENTS

JP   11-185497   7/1999

(Continued)

OTHER PUBLICATIONS

Decision of Grant dated Sep. 14, 2007 issued in corresponding Korean application No. 10-2006-0063779.

*Primary Examiner*—John P Trimmings
*Assistant Examiner*—Guerrier Merant
(74) *Attorney, Agent, or Firm*—Harness, Dickey & Pierce, P.L.C.

(57) ABSTRACT

A semiconductor memory device and methods thereof are provided. The example semiconductor memory device may include an internal address generating circuit operating in accordance with a first addressing protocol during normal operation and operating in accordance with a second addressing protocol during a test operation, the first addressing protocol associated with a first number of clock cycles for transferring a memory address and the second addressing protocol associated with a second number of clock cycles for transferring a memory address, the first number of clock cycles being greater than the second number of clock cycles. An example method may for achieving an single pumped address (SPA) mode in a semiconductor memory device configured for a double pumped address (DPA) mode may include receiving a first external address, generating a first internal address corresponding to the received first external address, receiving a second external address, generating a second internal address corresponding to the received second external address and delaying the generation of the first internal address to reduce a clock cycle interval between the generated first and second internal addresses.

25 Claims, 9 Drawing Sheets

U.S. PATENT DOCUMENTS

| | | |
|---|---|---|
| 6,212,113 B1 | 4/2001 | Maeda |
| 6,252,812 B1 | 6/2001 | Maeda |
| 6,876,564 B2 | 4/2005 | Kwon et al. |
| 6,889,268 B2 * | 5/2005 | Chae et al. .................. 710/35 |
| 6,898,139 B2 | 5/2005 | Lee et al. |
| 6,917,215 B2 | 7/2005 | Ichikawa |
| 6,973,000 B2 | 12/2005 | Inuzuka et al. |
| 6,992,949 B2 * | 1/2006 | Chae et al. ............ 365/230.06 |
| 2001/0038570 A1 * | 11/2001 | Nakano et al. ............. 365/233 |
| 2003/0031082 A1 * | 2/2003 | Sawada ..................... 365/233 |
| 2005/0078545 A1 * | 4/2005 | Chae et al. ............ 365/230.06 |
| 2005/0166097 A1 * | 7/2005 | An ............................ 714/42 |
| 2006/0294443 A1 * | 12/2006 | Fekih-Romdhane ........ 714/738 |

FOREIGN PATENT DOCUMENTS

| | | |
|---|---|---|
| JP | 11-306797 | 11/1999 |
| JP | 2003-098235 | 4/2003 |
| KR | 10-2005-0049236 | 5/2005 |

* cited by examiner

SEMICONDUCTOR MEMORY DEVICE AND METHODS THEREOF

This U.S. nonprovisional patent application claims priority under 35 U.S.C. §119 of Korean Patent Application 10-2006-0063779 filed on Jul. 7, 2006, the entire contents of which are hereby incorporated by reference.

BACKGROUND OF THE INVENTION

1. Field of the Invention

Example embodiments of the present invention relate generally to a semiconductor memory device and method thereof, and more particularly to a semiconductor memory device and methods of operating the semiconductor memory device.

2. Description of the Related Art

Conventional semiconductor memory devices have become increasingly smaller and more integrated, while a number of input/output (I/O) pins (e.g., for designating an address, transferring power or data, etc.) may tend to increase. For example, an external address may be applied to a semiconductor memory device during two clock cycles such that a number of pins sufficient to transfer the external address during a single clock cycle need not be included.

Such a system may be referred to as a Double Pumped Address (DPA) system. In contrast to the DPA system, a system where an external address may be transferred to a semiconductor memory device in a single clock or operating cycle, may be referred to as a single pumped address (SPA) system. A conventional DPA system is described with reference to FIGS. 1 to 3.

Figure 1:
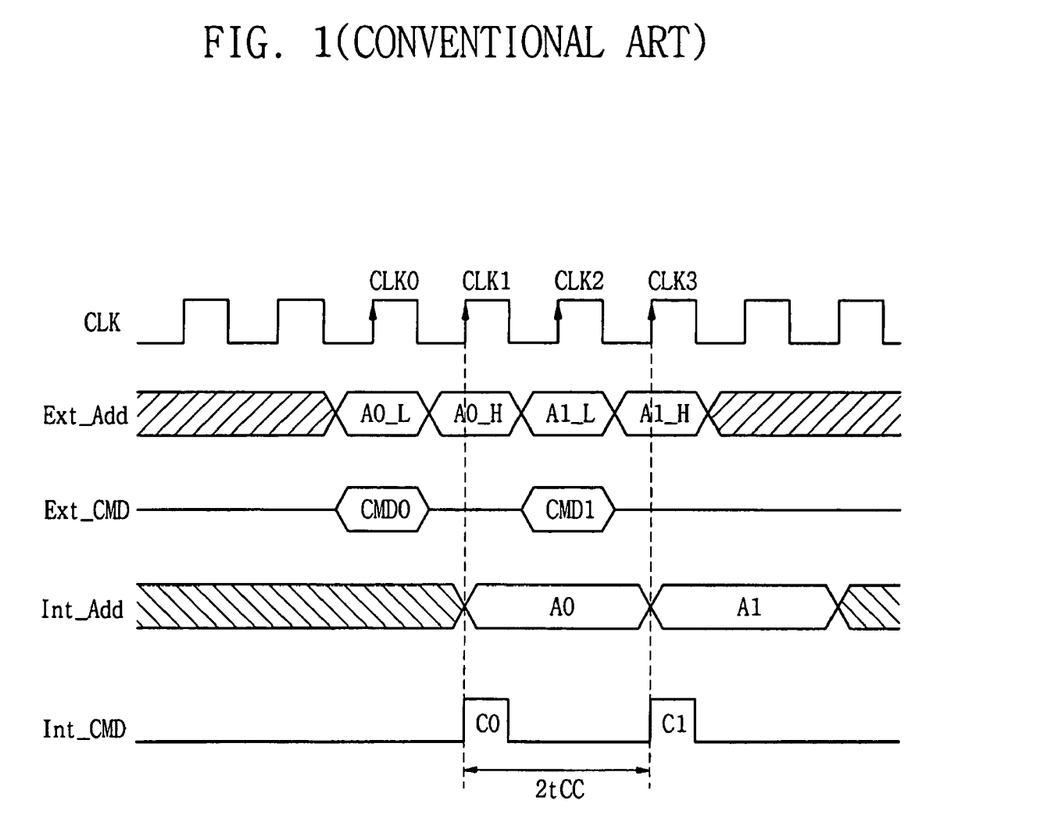
FIG. 1 illustrates timings of internal addresses in a conventional semiconductor memory device employing a double pumped address (DPA) system.

FIG. 1 illustrates timings of internal addresses in a conventional semiconductor memory device employing a DPA system.

Referring to FIG. 1, in the DPA system, an external address Ext_Add may be applied to a semiconductor memory device during two operating cycles of a clock signal CLK. That is, an address A0 may be divided into a lower address A0_L and a higher address A0_H, which may synchronize to operating cycles CLK0 and CLK1, respectively, and may be applied to the semiconductor memory device. Next, an address A1 may be divided into a lower address A1_L and a higher address A1_H, which may synchronize to operating cycles CLK2 and CLK3, respectively, and may be applied to the semiconductor memory device, and so on.

Referring to FIG. 1, a command CMD0 corresponding to the address A0 may be applied to the semiconductor memory device, and a command CMD1 corresponding to the address A1 may be applied to the semiconductor memory device. For purposes of explanation, it may be assumed that the command CMD0 is an active command, and the command CMD1 is a memory command (e.g., a read or write command).

Referring to FIG. 1, in the DPA system, a single address may be applied to the semiconductor memory device during two clock cycles as described above. A time interval between a first internal command C0 corresponding to the first command CMD0 and a second internal command C1 corresponding to the second command CMD1 may thereby be equal to two clock cycles 2TCC (e.g., an "operating cycle time"). In an example, the first command CMD0 and the second command CMD1 may be provided as successive or consecutive commands. Thus, a time interval between internal signals Int_Sig1 and Int_Sig2 shown in FIG. 2, which is described in greater detail later, may increase. The internal signals Int_Sig1 and Int_Sig2 may be used to trigger an operation corresponding to the internal commands C0 and C1, respectively, within the semiconductor memory device.

Figure 2:
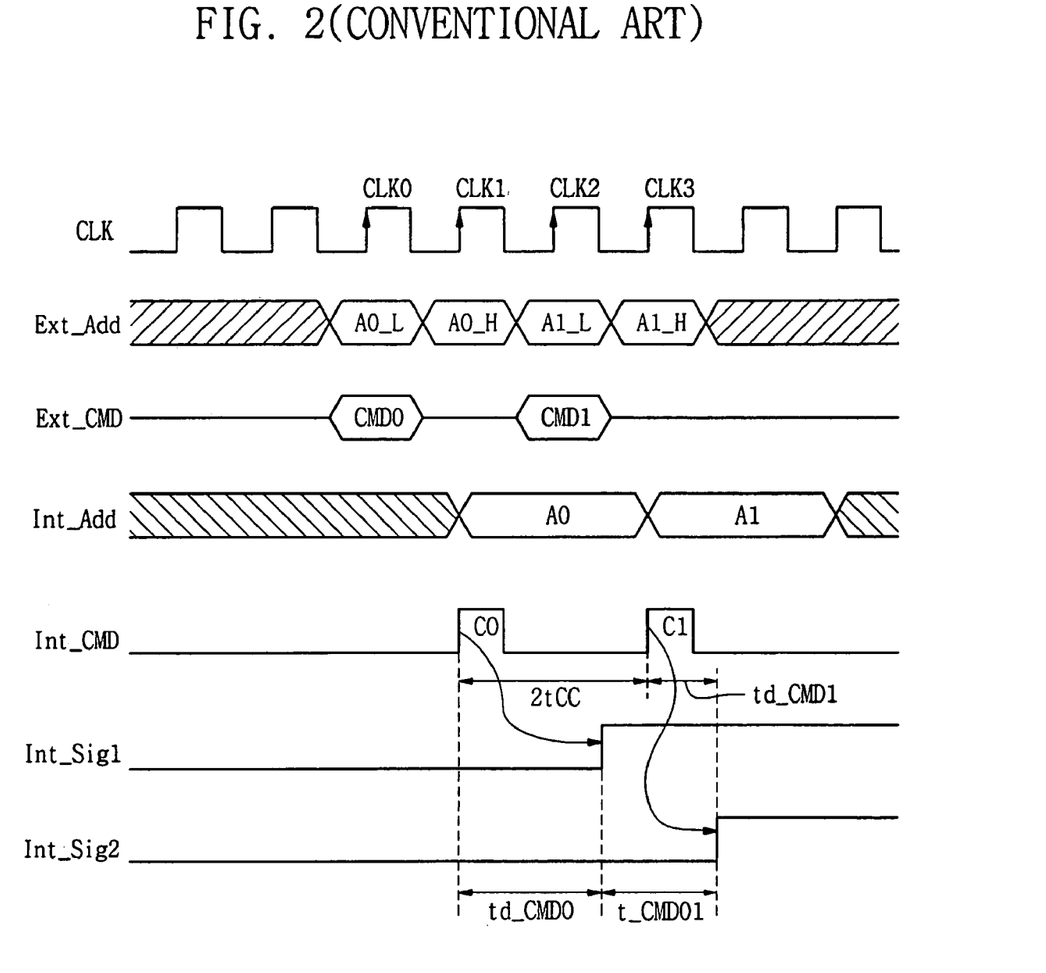
FIG. 2 illustrates timings of a time interval between internal signals in a conventional semiconductor memory device employing a single pumped address (SPA) system.

FIG. 2 illustrates timings of a time interval between internal signals in a conventional semiconductor memory device employing an SPA system.

Referring to FIG. 2, td_CMD0 may denote a delay time between first internal signal Int_Sig1 (e.g., based on or responsive to the first internal command C0), and the first internal command C0. td_CMD1 may denote a delay time between second internal signal Int_Sig2 (e.g., based on or responsive to the second internal command C1) and the second internal command C1. t_CMD01 may denote a delay time between the first internal signal Int_Sig1 based on the first internal command C0 and the second internal signal Int_Sig2 based on the second internal command C1.

Referring to FIG. 2, a magnitude of the delay time td_CMD0, td_CMD1 may be a fixed value (e.g., in a non-DPA system or SPA system), and the delay time t_CMD01 may be expressed by:

$$t\_CMD01 = 2tCC + td\_CMD1 - td\_CMD0 \qquad \text{Equation 1}$$

Referring to Equation 1, in calculating a point that t_CMD01 is equal to zero (e.g., a "0" margin point), Equation 1 may be reduced as follows $$2tCC + td\_CMD1 - td\_CMD0 = 0 \qquad \text{Equation 2}$$

$$tCC = (td\_CMD0 - td\_CMD1)/2 \qquad \text{Equation 3}$$

Thus, as shown in Equation 3, a shortest clock cycle time of a clock signal may be '(td_CMD0−td_CMD1)/2'. In contrast, in a DPA system, the delay time t_CMD01 may be expressed as $$t\_CMD01 = tCC + td\_CMD1 - td\_CMD0 \qquad \text{Equation 4}$$

Referring to Equation 4, in calculating a "0" margin point, Equation 3 may be reduced to $$tCC + td\_CMD1 - td\_CMD0 = 0 \qquad \text{Equation 5}$$

$$tCC = td\_CMD0 - td\_CMD1 \qquad \text{Equation 6}$$

Thus, as shown in Equation 6, a shortest clock cycle time of a clock signal may become 'td_CMD0−td_CMD1'. Thus, by comparing the shortest clock cycles derived based on Equation 3 (e.g., non-DPA or SPA) and Equation 6 (e.g., DPA), the shortest clock cycle time in the SPA system may be twice that of the shortest clock cycle time in the DPA system.

Figure 3:
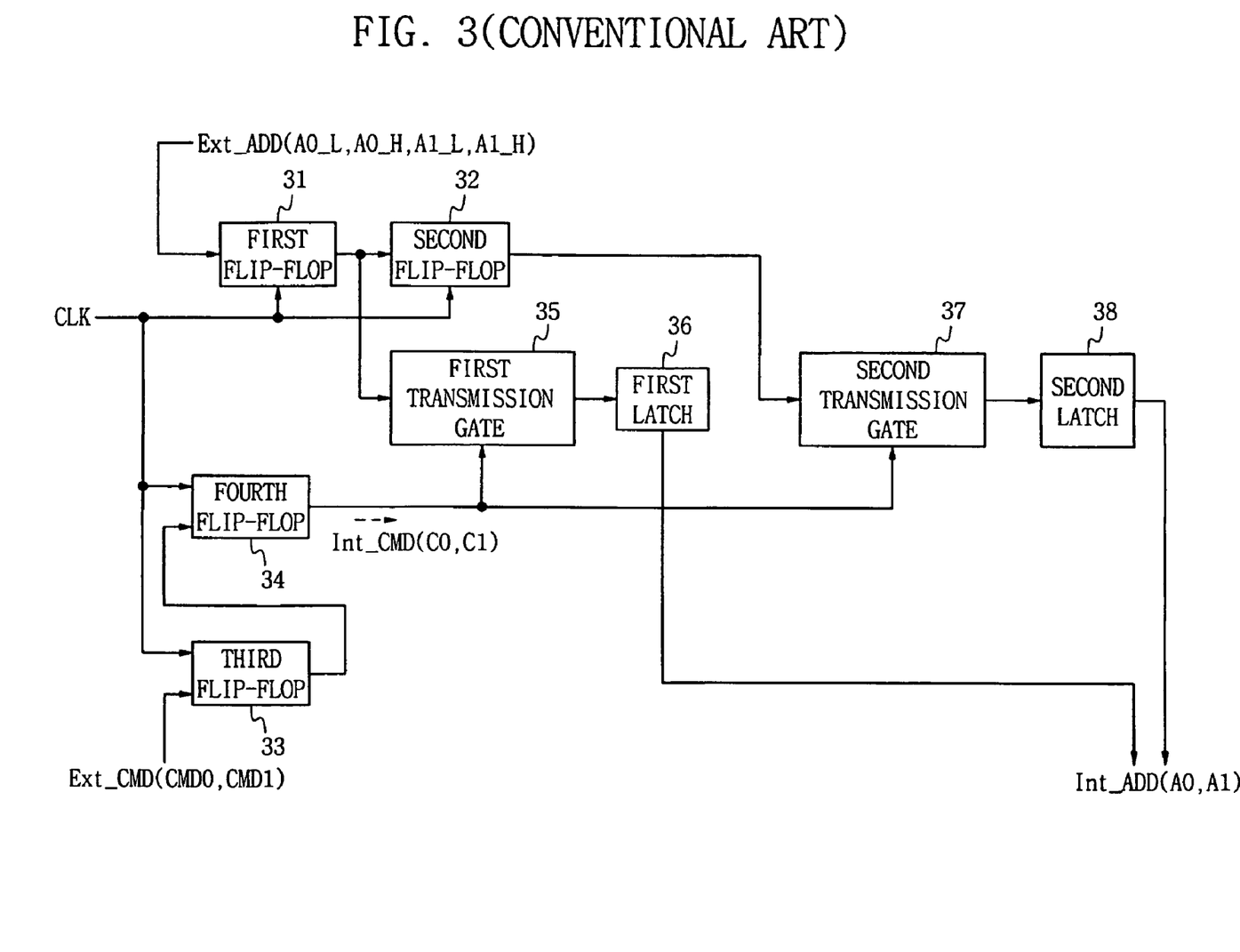
FIG. 3 is a block diagram schematically illustrating an internal address generating circuit of a semiconductor memory device employing a conventional DPA system having a characteristic of the timing diagram shown in FIG. 1.

FIG. 3 is a block diagram schematically illustrating an internal address generating circuit of a semiconductor memory device employing a conventional DPA system having a characteristic of the timing diagram shown in FIG. 1.

Referring to FIGS. 1 and 3, the internal address generating circuit may include first to fourth flip-flops 31 to 34, a first transmission gate 35 and a first latch 36, and a second transmission gate 37 and a second latch 38. The first flip-flop 31 and the second flip-flop 32 may receive two successive external addresses, a first external address A0_L, A0_H and a second external address A1_L, A1_H. The first flip-flop 31 and the second flip-flop 32 may operate in response to a clock signal CLK.

Referring to FIGS. 1 and 3, the first flip-flop 31 may transmit the first external address A0_L, A0_H to the first transmission gate 35 and the second transmission gate 37 in a second operating cycle CLK1 of the clock signal CLK. The first and second transmission gates 35 and 37 may not be turned in a first operating cycle CLK0 of the clock signal CLK. The third flip-flop 33 may output the first external command CMD0 corresponding to the first external address A0_L, A0_H to the fourth flip-flop 34 in response to the first operating cycle CLK0 of the clock signal CLK.

Referring to FIGS. 1 and 3, the fourth flip-flop 34 may output first internal command C0 as an internal command Int_CMD in a second operating cycle CLK1 of the clock signal CLK, to turn on the first transmission gate 35 and the second transmission gate 37. Thus, the first latch 36 and the second latch 38 may output a first internal address A0 as an internal address Int_ADD in the second operating cycle CLK1 of the clock signal CLK, and may apply the first internal address A0 to a next stage circuit.

Referring to FIGS. 1 and 3, the first transmission gate 35 and the second transmission gate 37 may be turned on by the second external command CMD1 in a fourth operating cycle CLK3 of the clock signal CLK. Thus, the first latch 36 and the second latch 38 may output a second internal address A1 as an internal address Int_ADD, and may apply the second internal address A1 to a next stage circuit.

Returning to FIG. 2, a time interval between the first external command CMD0 and the second external command CMD1 may correspond to two operating cycles. A time interval between the first internal command C0 and the second internal command C1, which may be internal commands corresponding to the external commands CMD0 and CMD1, may also correspond to two operating cycles 2tCC.

Referring to Equations 1 through 6, a margin between internal signals for two successive commands may be higher in a semiconductor memory device employing the DPA system. The margin between internal signals for two successive commands may be reduced by reducing an operating cycle time tCC of the clock signal CLK. A higher performance tester may be used to reduce the operating cycle time tCC. However, higher performance testers may typically be expensive. Thus, a semiconductor memory device employing a DPA system with cheaper, lower performance testers may have a relatively limited internal margin between commands.

Furthermore, measurements of parameters, such as AC parameters (e.g., tRCD, tRP, etc.) in a semiconductor memory device conforming to the DPA system, may be difficult if a shortest operating cycle time tCC of a tester is above a threshold. Thereby, it may be difficult to deploy lower performance testers (e.g., which may be cheaper) because lower performance testers may be associated with higher shortest operating cycle times tCC.

SUMMARY OF THE INVENTION

An example embodiment of the present invention is directed to a semiconductor memory device, including an internal address generating circuit operating in accordance with a first addressing protocol during normal operation and operating in accordance with a second addressing protocol during a test operation, the first addressing protocol associated with a first number of clock cycles for transferring a memory address and the second addressing protocol associated with a second number of clock cycles for transferring a memory address, the first number of clock cycles being greater than the second number of clock cycles.

Another example embodiment of the present invention is directed to a method of operating a semiconductor memory device, including operating an internal address generating circuit in accordance with a first addressing protocol during normal operation and operating the internal address generating circuit in accordance with a second addressing protocol during a test operation, the first addressing protocol associated with a first number of clock cycles for transferring a memory address and the second addressing protocol associated with a second number of clock cycles for transferring a memory address, the first number of clock cycles being greater than the second number of clock cycles.

Another example embodiment of the present invention is directed to a method for achieving an single pumped address (SPA) mode in a semiconductor memory device configured for a double pumped address (DPA) mode, including receiving a first external address, generating a first internal address corresponding to the received first external address, receiving a second external address, generating a second internal address corresponding to the received second external address and delaying the generation of the first internal address to reduce a clock cycle interval between the generated first and second internal addresses.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
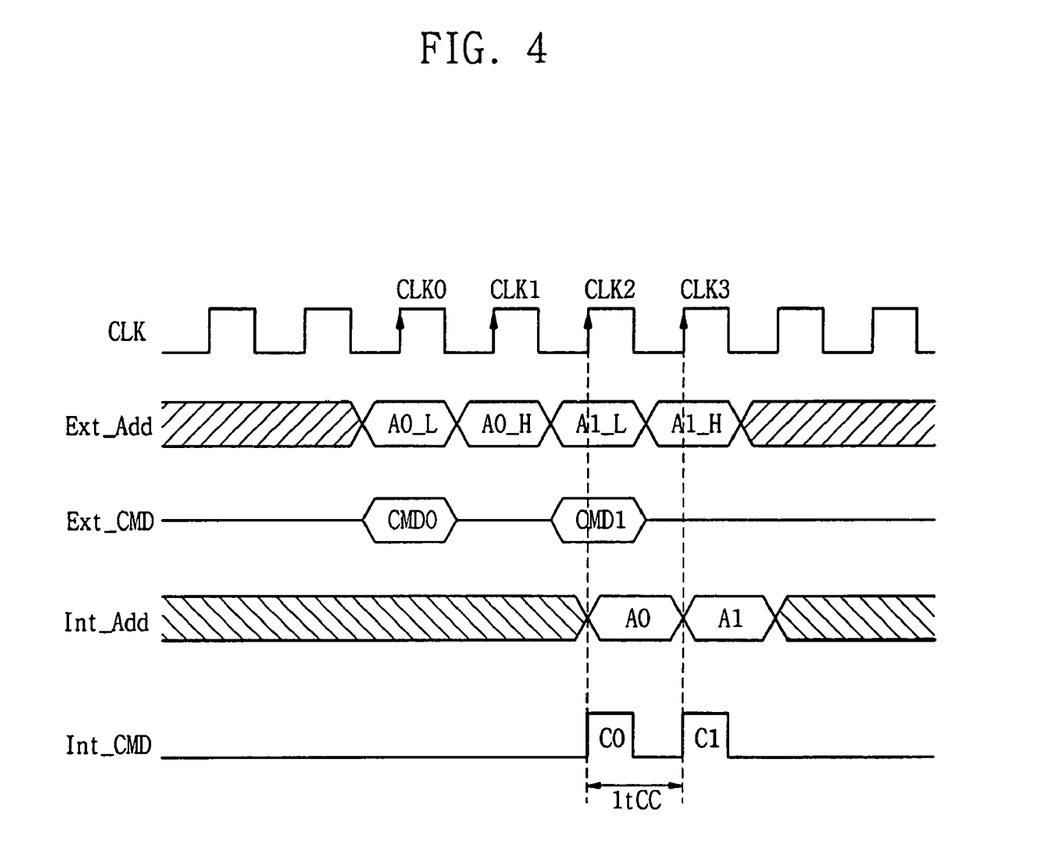
FIG. 4 illustrates a timing diagram for signals during an operation of an internal address generating circuit according to an example embodiment of the invention.

FIG. 4 illustrates a timing diagram for signals during an operation of an internal address generating circuit according to an example embodiment of the invention.

In the example embodiment of FIG. 4, in a semiconductor memory device employing a DPA system (e.g., wherein an external address may be divided and transferred during two successive or consecutive clock cycles), the internal address generating circuit may delay an internal address A0 corresponding to the "divided" external address A0_L and A0_H by a single clock or operating cycle and an internal command C0 may also be delayed by a single clock or operating cycle. A comparison will now be provided between the conventional timing diagram of FIG. 1 and the example timing diagram of FIG. 4.

Referring to FIG. 1 an internal address A0 and an internal command C0 may be generated in response to a second operating cycle CLK1 of a clock signal CLK. In the example embodiment of FIG. 4 an internal command C0 may be generated in response to a third operating cycle CLK2 of the clock signal CLK. Thus, a time interval between successive internal commands C0 and C1 in a semiconductor memory device employing the example DPA system may be shorter by, for example, one clock or operating cycle, as compared with a time interval between successive internal commands C0 and C1 in a semiconductor memory device employing a conventional DPA system. Thus, by delaying a first internal command among two consecutive internal commands, an interval between the first and second internal commands may be reduced.

Thus, referring again to FIG. 1, in the conventional art, a time interval between the internal commands C0 and C1 may be 2tCC irrespective of whether the internal address generating circuit is operating in accordance with a test mode or a normal operating mode. In contrast, according to an example embodiment of the present invention, a time interval between the internal commands C0 and C1 may be 1tCC (e.g., in a test mode), via the delay of the first internal command. Internal signals Int_Sig1 and Int_Sig2 based on the internal commands C0 and C1 will now be described with reference to FIG. 5.

Figure 5:
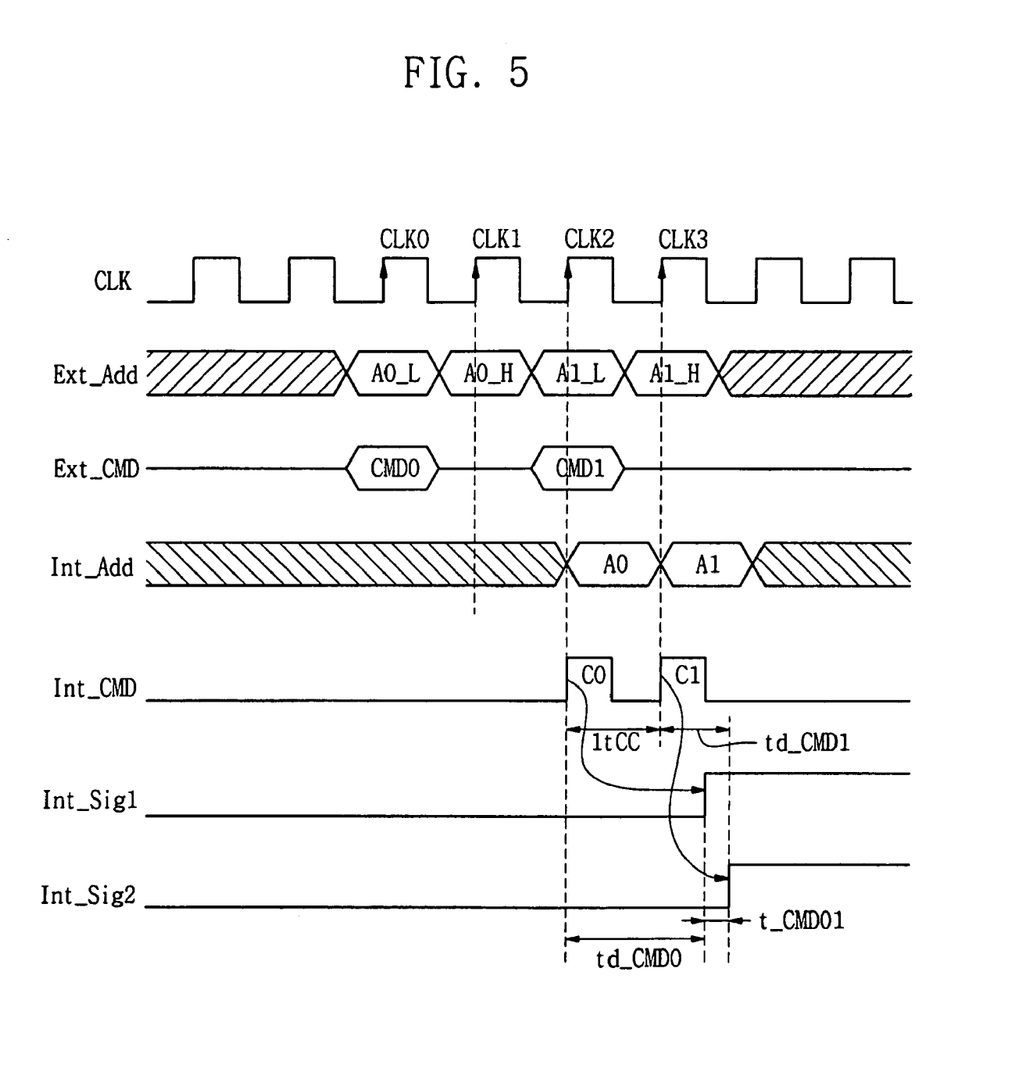
FIG. 5 illustrates a timing diagram indicating a time interval between internal signals Int_Sig1 and Int_Sig2 based on the internal commands C0 and C1 of FIG. 4 according to another example embodiment of the present invention.

FIG. 5 illustrates a timing diagram indicating a time interval between internal signals Int_Sig1 and Int_Sig2 based on the internal commands C0 and C1 of FIG. 4 according to another example embodiment of the present invention. Illustrated in the example embodiment of FIG. 5 are a first delay time td_CMD0, a second delay time td_CMD1 and a delay time t_CMD01 between the internal signals Int_Sig1 and Int_Sig2. In the example embodiment of FIG. 5, the "0" margin point may be 'tCC=td_CMD0−td_CMD1' (e.g., based on Equations 4 through 6, as discussed in the Background of the Invention section), and a shortest clock cycle time of clock signal CLK may be 'td_CMD0−td_CMD1'.

In the example embodiment of FIG. 5, the internal command C0 may be delayed by a single operating cycle in a test mode, thereby reducing a time interval between internal commands C0 and C1 (e.g., to 1tCC). Thus, a number of parameters conventionally difficult to measure within the DPA system may be measured with a lower priced (e.g., less efficient) test because the time interval between successive internal commands C0 and C1 may be reduced (e.g., by one clock cycle). Hereinafter, the test mode may be referred to as an "SPA" mode because the time interval between the internal commands C0 and C1 may be 1tCC (e.g., similar to conventional SPA systems).

Figure 6:
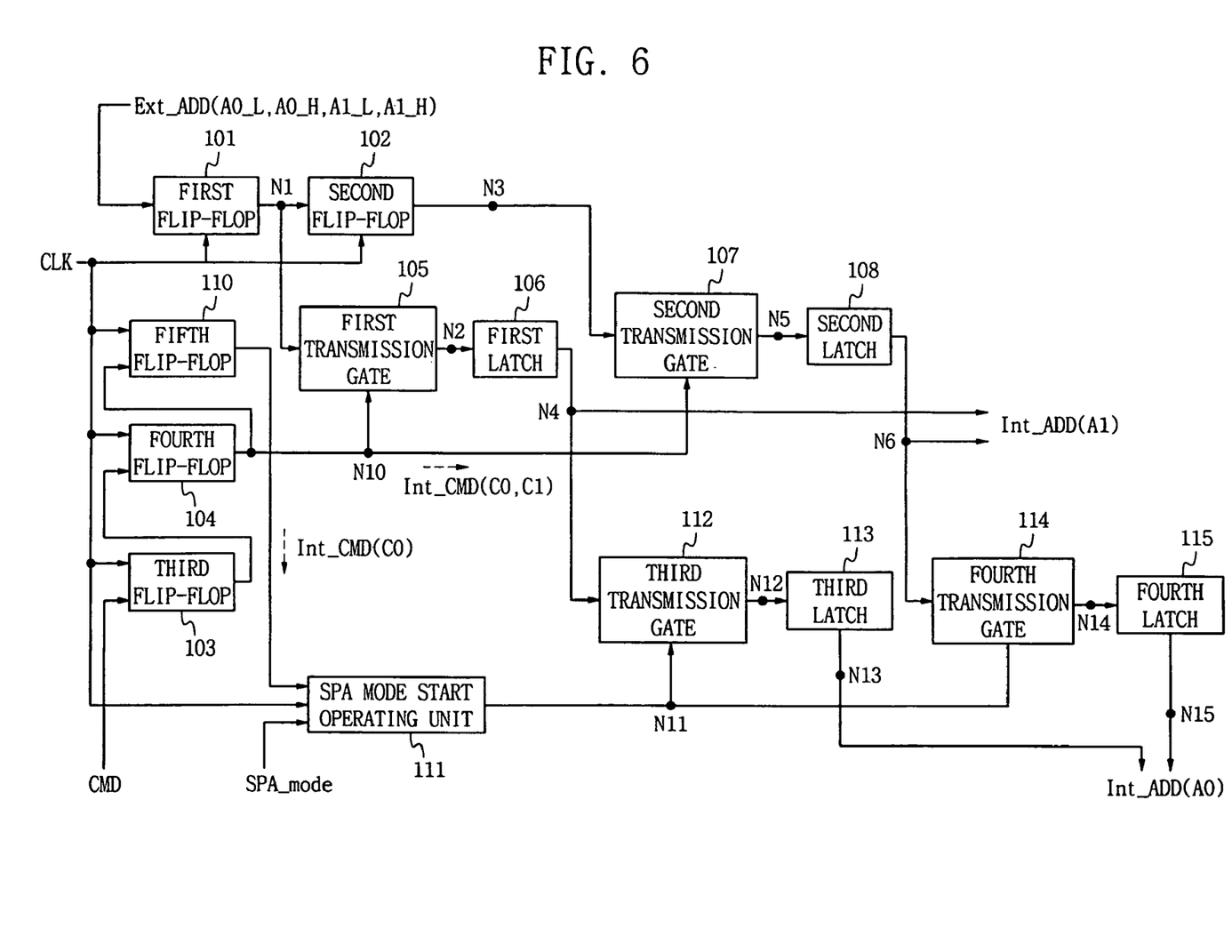
FIG. 6 is a block diagram of an internal address generating circuit according to another example embodiment of the present invention.

FIG. 6 is a block diagram of an internal address generating circuit according to another example embodiment of the present invention.

In the example embodiment of FIG. 6, the internal address generating circuit may include first and second flip-flops 101 and 102, third to fifth flip-flops 103, 104 and 110, first and second latches 106 and 108, third and fourth latches 113 and 115 and an SPA mode start operating unit 111. The internal address generating circuit may further include first and second transmission gates 105 and 107, which may be respectively positioned in front of the first and second latches 106 and 108, and may further include third and fourth transmission gates 112 and 114, which may be respectively positioned in front of the third and fourth latches 113 and 115.

In the example embodiment of FIG. 6, the first and second flip-flops 101 and 102 may receive first and second external addresses A0_L, A0_H, A1_L, A1_H, and may transfer the received external addresses to the first and second transmission gates 105 and 107 in response to clock signal CLK.

In the example embodiment of FIG. 6, the third to fifth flip-flops 103, 104 and 110 may receive first and second external commands CMD0 and CMD1, and may generate the first and second internal commands C0 and C1 in response to the clock signal CLK. For example, the fifth flip-flop 110 may operate such that the first internal command C0 may be delayed by a single operating cycle and may then be applied to the SPA mode start operating unit 111.

In the example embodiment of FIG. 6, the first and second transmission gates 105 and 107 may be positioned in front of the first and second latches 106 and 108, respectively, and may be turned on or off based on an output signal of the fourth flip-flop 104, to selectively apply output signals of the first and second flip-flops 101 and 102 to the first and second latches 106 and 108, respectively.

In the example embodiment of FIG. 6, the third and fourth transmission gates 112 and 114 may be positioned in front of the third and fourth latches 113 and 115, respectively, and may be turned on or off based on an output signal of the SPA mode start operating unit 111, to selectively apply output signals of the first and second latches 106 and 108 to the third and fourth latches 113 and 115, respectively.

Figure 7:
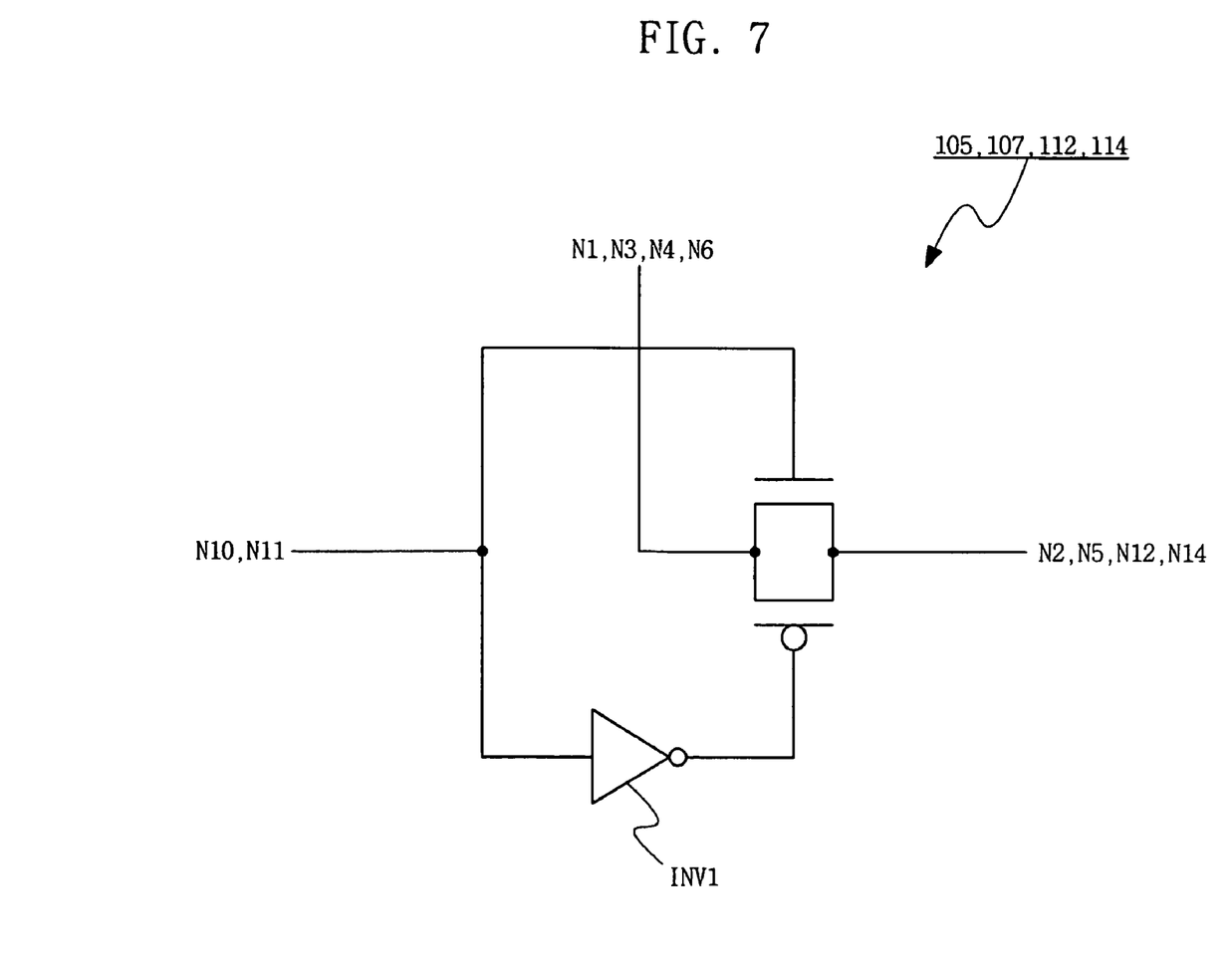
FIG. 7 illustrates a transmission gate according to another example embodiment of the present invention.

FIG. 7 illustrates a transmission gate according to another example embodiment of the present invention. In an example, the transmission gate of FIG. 7 may be representative of the first to fourth transmission gates 105, 107, 112 and 114.

In the example embodiment of FIG. 7, the first to fourth transmission gates 105, 107, 112 and 114 may each include one NMOS transistor and one PMOS transistor. In an example, the first and second transmission gates 105 and 107 may be turned on if the fourth flip-flop 104 outputs internal commands C0 and C1, and may otherwise be turned off. An output signal of the SPA mode start operating unit 111 may be applied to a gate of an NMOS transistor of each of the third and fourth transmission gates 112 and 114. An inverted version of the output signal of the SPA mode start operating unit 111 may be applied to a gate of the PMOS transistor. The third and fourth transmission gates 112 and 114 may be turned on if the SPA mode start operating unit 111 outputs a signal set to a first logic level (e.g., a higher logic level or logic "1").

In the example embodiment of FIG. 7, the first and second latches 106 and 108 may latch output signals of the first and second flip-flops 101 and 102, respectively. The first and second latches 106 and 108 may output a second internal address A1 if the first and second transmission gates 105 and 107 are turned on by the second internal command C1. The first internal address A0 may be generated by sampling an output signal of the third and fourth latches 113 and 115.

In the example embodiment of FIG. 7, the third and fourth latches 113 and 115 may latch output signals of the first and second latches 106 and 108, respectively, and may output the first internal address A0.

Figure 8:
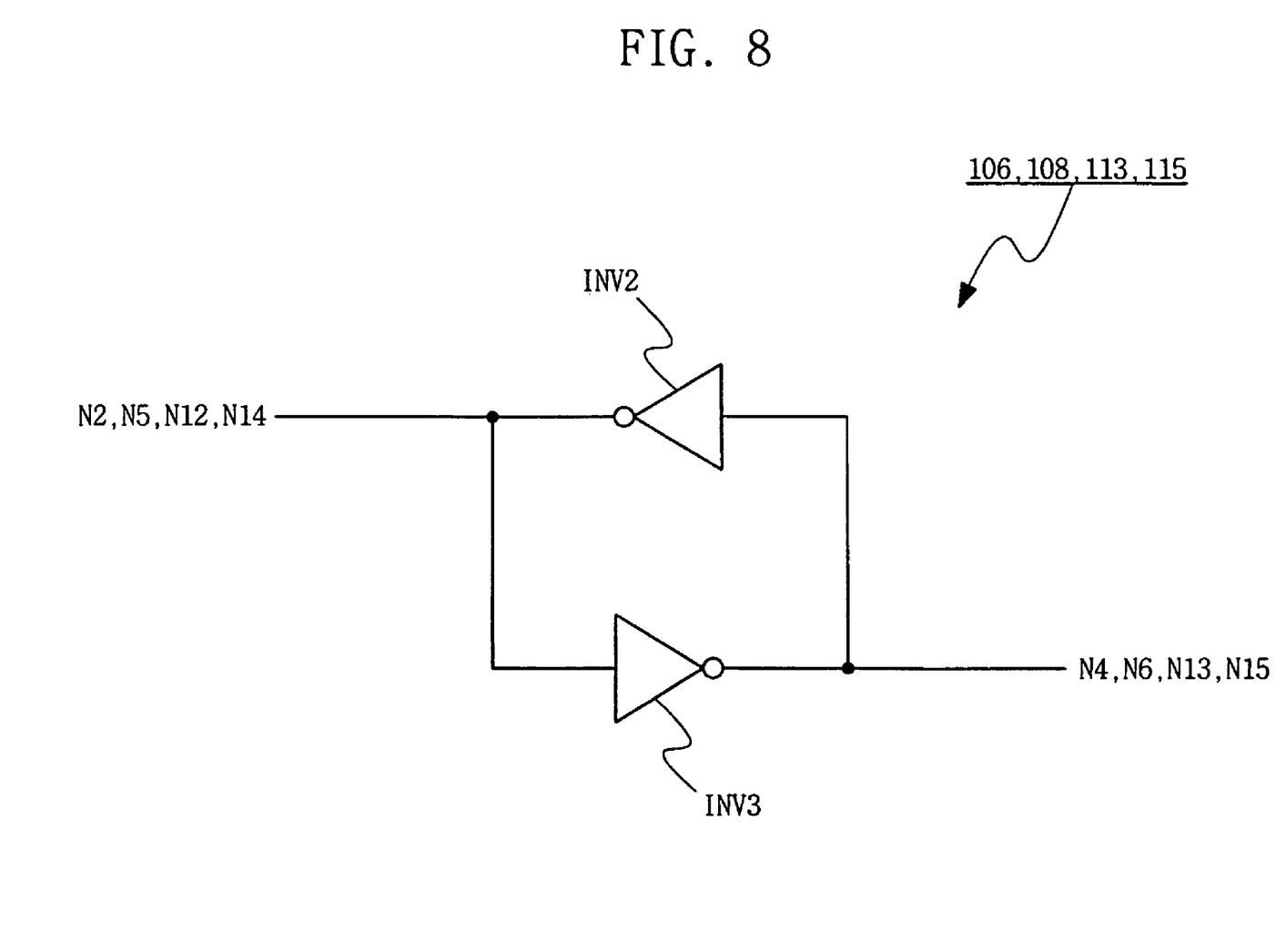
FIG. 8 illustrates a latch according to another example embodiment of the present invention.

FIG. 8 illustrates a latch according to another example embodiment of the present invention. In an example, the latch of FIG. 8 may be representative of each of the first to fourth latches 106, 108, 113 and 115.

In the example embodiment of FIG. 8, the first to fourth latches 106, 108, 113 and 115 may each arranged as an "inverter chain" including inverters INV2 and INV3. The first and second latches 106 and 108 may latch an output signal of the first and second flip-flops 101 and 102, respectively, if the first and second transmission gates 105 and 107 are turned on, and the third and fourth latches 113 and 115 may receive the signal latched by the first and second latches 106 and 108, respectively, if the third and fourth transmission gates 112 and 114 are turned on.

In the example embodiment of FIG. 8, the SPA mode start operating unit 111 may receive the clock signal CLK, an output signal of the fifth flip-flop 110 as an internal command Int_CMD and an SPA mode signal SPA_mode, and may perform a logical operation to delay the first internal address A0 (e.g., by a single clock or operating cycle).

Figure 9:
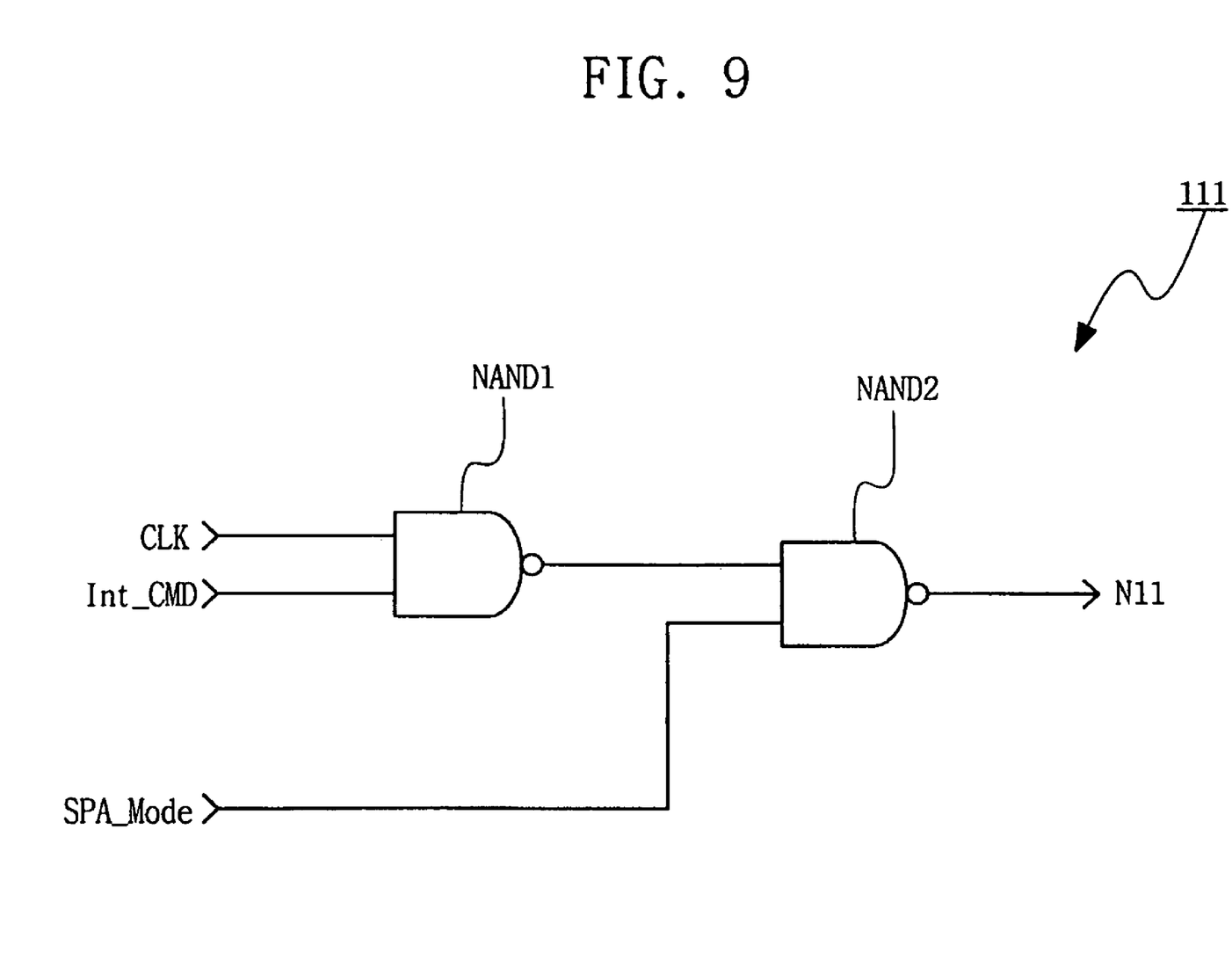
FIG. 9 illustrates a SPA mode start operating unit according to another example embodiment of the present invention.

FIG. 9 illustrates the SPA mode start operating unit 111 according to another example embodiment of the present invention. In the example embodiment of FIG. 9, the SPA mode start operating unit 111 may include a first NAND gate NAND1 and a second NAND gate NAND2.

In the example embodiment of FIG. 9, the first NAND gate NAND1 may receive and perform a first NAND operation on the clock signal CLK and an output signal Int_CMD of the fifth flip-flop 110. The second NAND gate NAND2 may receive and perform a second NAND operation on an output signal of the first NAND gate NAND1 and an SPA mode signal SPA_mode, and may transfer a result of the second NAND operation to the third and fourth transmission gates 112 and 114.

In the example embodiment of FIG. 9, if the SPA mode signal SPA_mode is set to a second logic level (e.g., a lower logic level or logic "0"), an output signal of the second NAND gate NAND2 may be set to the first logic level (e.g., a higher logic level or logic "1") irrespective of a logic level of the output signal of the first NAND gate NAND1. In an example, setting the SPA mode signal SPA_mode to the second logic level may be indicative of a "normal" operation mode (e.g., a non-test mode). Alternatively, if the SPA mode signal SPA_mode is set to the first logic level (e.g., a higher logic level or logic "1"), an output signal of the second NAND gate NAND2 may be affected by a logic level of the output or result of the first NAND gate NAND1. In an example, setting the SPA mode signal SPA_mode to the first logic level may be indicative of a "test" operation mode. In a further example, in the test mode, if the output of the first NAND gate NAND1 is set to the first logic level, the second NAND gate NAND2 may output the second logic level (e.g., a lower logic level or logic "0"). Alternatively, in the test mode, if the output of the first NAND gate NAND1 is set to the second logic level, the second NAND gate NAND2 may output the first logic level (e.g., a higher logic level or logic "1").

In the example embodiment of FIGS. 4 through 9, in terms of the relation between two successive internal commands C0 and C1 within each of FIGS. 1 and 4, the test mode of FIG. 4 may operate in a manner similar to that of a conventional SPA system, whereas, in normal operation, FIG. 4 may correspond to a DPA mode.

In the example embodiment of FIGS. 4 through 9, a first external address A0_L, A0_H and a first external command CMD0 may be applied. If a second external address A1_L, A1_H and a second external command CMD1 are applied two clock cycles or operating cycles following the first external command CMD0, a first internal address A0 and a first internal command C0 corresponding to each of the first external address A0_L, A0_H and the first external command CMD0 may be output in a next operating cycle CLK2 (e.g., see FIG. 4) following a second operating cycle CLK1 (e.g., see FIG. 4) to apply the first external address A0_L, A0_H. Thus, the internal address generating circuit may maintain a single operating clock cycle for a time interval between the first internal command C0 and a second internal command C1 corresponding to the second external command CMD1, in a test mode. Accordingly, a delay time t_CMD01 (e.g., see FIG. 5) may be reduced.

In the example embodiment of FIGS. 4 through 9, a semiconductor memory device of a DPA system having an internal address generating circuit may operate in a manner similar to that of a semiconductor memory device of an SPA system in a test mode, thus a plurality of parameters may be measured in a "lower quality" tester having a longer tCC.

In the example embodiment of FIGS. 4 through 9, in an example, the first external command CMD0 may be an active command and the second external command CMD1 may be a memory instruction (e.g., a read or write command).

Example operation of the internal address generating circuit in the semiconductor memory device of the DPA system will now be described with reference to the example embodiments of FIGS. 4 to 6, as follows.

In example operation of a semiconductor memory device within a DPA system operating in accordance to an example embodiment of the present invention, with reference to FIGS. 4 through 6, a first external address A0_L, A0_H may be divided into a first lower address A0_L and a first higher address A0_H, to correspond to different operating cycles. The first lower address A0_L may be applied to an address pin (not shown) based on a setup time and hold time, so as to apply the first lower address A0_L to the interior of the circuit in response to a first operating cycle CLK0 of clock signal CLK. The first higher address A0_H may be applied to an address pin (not shown) based on a setup time and hold time, so as to apply the first higher address A0_H to the interior of the circuit in response to a second operating cycle CLK1 of clock signal CLK.

In example operation of a semiconductor memory device within a DPA system operating in accordance to an example embodiment of the present invention, with reference to FIGS. 4 through 6, a second external address A1_L, A1_H may be divided into a first lower address A1_L and a second higher address A1_H, to correspond to different operating cycles. The second lower address A1_L may be applied to the interior of the circuit in response to a third operating cycle CLK2 of the clock signal CLK. The second higher address A1_H may be applied to the interior of the circuit in response to a fourth operating cycle CLK3 of the clock signal CLK.

In example operation of a semiconductor memory device within a DPA system operating in accordance to an example embodiment of the present invention, with reference to FIGS. 4 through 6, if the first external address A0_L, A0_H and the second external address A1_L, A1_H include 12 bits, the first lower address A0_L and the second lower address A1_L may include 6 bits, and the first higher address A0_H and the second higher address A1_H may include 6 bits.

In example operation of a semiconductor memory device within a DPA system operating in accordance to an example embodiment of the present invention, with reference to FIGS. 4 through 6, the first flip-flop 101 may output the first lower address A0_L to the first transmission gate 105 and the second flip-flop 102 in response to the first operating cycle CLK0 of the clock signal CLK, and may output the first higher address A0_H to the first transmission gate 105 and the second flip-flop 102 in response to the second operating cycle CLK1 of the clock signal. The first flip-flop 101 may output the second lower address A1_L to the first transmission gate 105 and the second flip-flop 102 in response to the third operating cycle CLK2 of the clock signal, and may output the second higher address A1_H to the first transmission gate 105 and the second flip-flop 102 in response to the fourth operating cycle CLK3 of the clock signal CLK.

In example operation of a semiconductor memory device within a DPA system operating in accordance to an example embodiment of the present invention, with reference to FIGS. 4 through 6, the second flip-flop 102 may be coupled to an output terminal of the first flip-flop 101 and may receive an output signal of the first flip-flop 101. The second flip-flop 102 may output the first lower address A0_L to the second transmission gate 107 in response to the second operating cycle CLK1 of the clock signal CLK, and may output the second lower address A1_L to the second transmission gate 107 in response to the fourth operating cycle CLK3 of the clock signal CLK.

In example operation of a semiconductor memory device within a DPA system operating in accordance to an example embodiment of the present invention, with reference to FIGS. 4 through 6, the third flip-flop 103 may receive the first external command CMD0, and may output the first internal command C0 to the fourth flip-flop 104 in response to the first operating cycle CLK0 of the clock signal. The third flip-flop 103 may receive second external command CMD1 applied two operating cycles after the first external command CMD0, and may output the second internal command C1 to the fourth flip-flop 104 in response to the third operating cycle CLK2 of the clock signal CLK.

In example operation of a semiconductor memory device within a DPA system operating in accordance to an example embodiment of the present invention, with reference to FIGS. 4 through 6, the fourth flip-flop 104 may receive the first internal command C0 output from the third flip-flop 103, and may output the first internal command C0 to the fifth flip-flop 110, the first transmission gate 105 and the second transmission gate 107, in response to the second operating cycle CLK1 of the clock signal CLK. The fourth flip-flop 104 may receive the second internal command C1 output from the third flip-flop 103, and may output the second internal command C1 to the fifth flip-flop 110, the first transmission gate 105 and the second transmission gate 107, in response to the fourth operating cycle CLK3 of the clock signal CLK.

In example operation of a semiconductor memory device within a DPA system operating in accordance to an example embodiment of the present invention, with reference to FIGS. 4 through 6, the fifth flip-flop 110 may receive the first internal command C0 output from the fourth flip-flop 104, and may output the first internal command C0 to the SPA mode start operating unit 111 in response to the third operating cycle CLK2 of the clock signal CLK. If an SPA mode signal SPA_mode is set to the first logic level (e.g., a higher logic level or logic "1") to indicate a test mode, the third transmission gate 112 and the fourth transmission gate 114 may be turned on based on the first internal command C0 as an output signal of the fifth flip-flop 110. The third latch 113 and the fourth latch 115 may individually latch signals applied from the third transmission gate 112 and the fourth transmission gate 114, and may output the first internal address A0.

In example operation of a semiconductor memory device within a DPA system operating in accordance to an example embodiment of the present invention, with reference to FIGS. 4 through 6, the fourth flip-flop 104 may output the second internal command C1 to the first transmission gate 105 and the second transmission gate 107 in a fourth operating cycle CLK3 of the clock signal CLK. Thus, the first transmission gate 105 and the second transmission gate 107 may be turned on, and the first latch 106 and second latch 108 may individually latch output signals of the first flip-flop 101 and the second flip-flop 102, and may output the second internal address A1.

In example operation of a semiconductor memory device within a DPA system operating in accordance to an example embodiment of the present invention, with reference to FIGS. 4 through 6, the first to fifth flip-flops 101, 102, 103, 104 and 110 may be flip-flop circuits configured to synchronize an input signal to a clock signal CLK and to output the signal. In an example, the first to fifth flip-flops 101 through 110 may be embodied as any well-known type of flip-flop, such as an RS flip-flop, a D flip-flop, a sense amplifier D flip-flop, etc. Such flip-flips are well-known in the art and will not be described further for the sake of brevity.

In example operation of a semiconductor memory device within a DPA system operating in accordance to an example embodiment of the present invention, with reference to FIGS. 4 through 6, the first and second transmission gates 105 and 107 may be controlled and turned on in response to the first internal command C0 received from the fourth flip-flop 104 during a second operating cycle CLK1 of the clock signal CLK, and may also be turned on in response to the second internal command C1 received from the fourth flip-flop 104 during a fourth operating cycle CLK3 of the clock signal CLK.

In example operation of a semiconductor memory device within a DPA system operating in accordance to an example embodiment of the present invention, with reference to FIGS. 4 through 6, the third and fourth transmission gates 112 and 114 may be turned off if an output signal of the SPA mode start operating unit 111 is set to the second logic level (e.g., a lower logic level or logic "0"), and may be turned on if the SPA mode start operating unit 111 is set to the first logic level (e.g., a higher logic level or logic "1"). In an example, the SPA mode start operating unit 111 may continuously output a signal set to the first logic level (e.g., a higher logic level or logic "1") in modes other than the test mode. Thus, in a normal operating mode, the third transmission gate 112 and the fourth transmission gate 114 may be turned-on and the first internal address A0 may not be delayed by one operating cycle. Thus, in the normal operating mode, an example operation may be similar to the of a semiconductor memory device employing a DPA system (e.g., although a relatively small amount of delay may occur on an address path by the third transmission gate 112 and the third latch 113, and the fourth transmission gate 114 and the fourth latch 115).

Alternatively, in the test mode, the SPA mode start operating unit 111 may output a signal set to the second logic level (e.g., a lower logic level or logic "0") in the second operating cycle CLK1 of the clock signal CLK, and may output the signal set to the first logic level (e.g., a higher logic level or logic "1") in the third operating cycle CLK2 of the clock signal. Signals output from the first and second latches 106 and 108 may be sampled as second internal address A1 in the fourth operating cycle CLK4 of the clock signal CLK. Then, a time interval between the first and second internal addresses A0 and A1 may be an interval of one operating cycle of clock signal CLK.

In another example embodiment of the present invention, a semiconductor memory of a DPA system including an internal address generating circuit may reduce a margin between internal signals Int_Sig1 and Int_Sig2 (e.g., by one clock cycle or 1tCC) through each of first internal command C0 and a successive second internal command C1 in a test mode as compared to conventional DPA systems. Consequently, a plurality of parameters may be measured by reducing a time interval between internal signals Int_Sig1 and Int_Sig2 through two successive commands, such that lower priced or quality equipment may be used, which may lessen the cycle time tCC of a clock signal.

In another example embodiment of the present invention, referring to FIGS. 4 to 6, an SPA mode may be implemented within a semiconductor memory device configured as a DPA system such that a received external address may be divided or partitioned so as to correspond to two successive operating cycles of a clock signal. A first external address A0_L, A0_H and a first external command CMD0 corresponding to the first external address A0_L, A0_H may be applied to the semiconductor memory device. A second external address A1_L, A1_H and a second external command CMD1 corresponding to the second external address A1_L, A1_H, may be applied to the semiconductor memory device, so as to be consecutive (e.g., in a consecutive clock cycle) with respect to the first external address A0_L, A0_H. An SPA mode signal SPA_mode may further be applied. A first internal address A0 and a first internal command C0 individually corresponding to the first external address A0_L, A0_H and the first external command CMD0 may then be output in an operating cycle CLK2 (two operating cycles after a first operating cycle CLK0 from among two operating cycles CLK0 and CLK1 of the clock signal CLK) to apply the first external address A0_L, A0_H. A second internal address A1 and a second internal command C1 individually corresponding to the second external address A1_L, A1_H and the second external command CMD1 may be output in response to an operating cycle CLK3 adjacent or subsequent to an operating cycle CLK2 in which the first internal command C0 is output.

In another example embodiment of the present invention, a semiconductor memory device and a method for achieving an SPA mode may provide advantages related to measuring and estimating parameters, such as tRCD(/RAS to /CAS Delay time), tRP(/RAS Precharge time), etc., during a test mode (e.g., even if a relatively low-performance tester is used).

In another example embodiment of the present invention, a semiconductor memory device of a DPA system may be configured to have a test mode operating in accordance with an SPA mode, and an SPA mode. Thus, DPA mode compliant testers need not be included within semiconductor memory devices operating in accordance with DPA mode during normal operations because a cheaper, SPA tester may be included for use during a test mode. Thus, DPA systems may be backwards compatible with SPA testers to reduce costs associated with testing procedures.

Example embodiments of the present invention being thus described, it will be obvious that the same may be varied in many ways. For example, while the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A semiconductor memory device, comprising:
an internal address generating circuit operating in accordance with a first addressing protocol during normal operation and operating in accordance with a second addressing protocol during a test operation, the first addressing protocol associated with a first number of clock cycles for transferring a memory address and the second addressing protocol associated with a second number of clock cycles for transferring a memory address, the first number of clock cycles being greater than the second number of clock cycles wherein, during the test operation,
a first external address is received during first and second clock cycles of a clock signal, and the internal address generating circuit outputs a first internal address and a first internal command in a third clock cycle of the clock signal, the first internal address and the first internal command respectively corresponding to the first external address and a first external command, a second external address is consecutively received after the first external address and a second external command is received two clock cycles from that of the first external command, wherein an interval between the first internal command and a second internal command corresponding to the second external command is equal to a single clock cycle.

2. The semiconductor memory device of claim 1, wherein the first addressing protocol is a double pumped address (DPA) protocol and the second addressing protocol is a single pumped address (SPA) protocol, the DPA protocol allowing memory address transfers during two clock cycles and the SPA protocol allowing memory address transfers during a single clock cycle.

3. The semiconductor memory device of claim 1, wherein the internal address generating circuit includes:

first and second flip-flips for receiving the first and second external addresses, the first and second flip-flips operating in response to the clock signal;

third, fourth and fifth flip-flops for receiving the first and second external commands and generating the first and second internal commands in response to the clock signal;

first and second latches for latching output signals of the first and second flip-flops, respectively, and outputting a second internal address corresponding to the second external address;

third and fourth latches for latching output signals of the first and second latches, respectively, and outputting the first internal address; and a single pumped address (SPA) mode start operating unit for receiving the clock signal, an output signal of the fifth flip-flop and an SPA mode signal, and performing a logical operation so as to delay the first internal address by one clock cycle.

4. The semiconductor memory device of claim 3, wherein the internal address generating circuit further includes:

first and second transmission gates positioned in front of the first and second latches, respectively, the first and second transmission gates selectively turned on or off based on an output signal of the fourth flip-flop, to selectively apply output signals of the first and second flip-flops to the first and second latches.

5. The semiconductor memory device of claim 4, wherein the internal address generating circuit further includes:

third and fourth transmission gates positioned in front of the third and fourth latches, respectively, the third and fourth transmission gates selectively turned on or off based on an output signal of the SPA mode start operating unit, to selectively apply output signals of the first and second latches to the third and fourth latches.

6. The semiconductor memory device of claim 5, wherein each of the third and fourth transmission gates include:

an n-type Metal Oxide Semiconductor (NMOS) transistor including a gate receiving the output signal of the SPA mode start operating unit; and a p-type Metal Oxide Semiconductor (PMOS) transistor including a gate receiving an inverted version of the output signal of the SPA mode start operating unit.

7. The semiconductor memory device of claim 5, wherein the SPA mode start operating unit includes:

a first NAND gate performing a NAND operation on the clock signal and the output signal of the fifth flip-flop to output a first NAND result; and a second NAND gate performing a NAND operation on the first NAND result and the SPA mode signal, and outputting a second NAND result to the third and fourth transmission gates.

8. The semiconductor memory device of claim 1, wherein the internal address generating circuit outputs a second internal address and a second internal command respectively corresponding to the second external address and the second external command in a fourth clock cycle of the clock signal, the first external command is received during the first clock cycle of the clock signal, and the second external address and the second external command are received during the third and fourth clock cycles of the clock signal.

9. The semiconductor memory device of claim 8, wherein the internal address generating circuit comprises:

first and second flip-flips for receiving the first and second external addresses, the first and second flip-flips operating in response to the clock signal;

third, fourth and fifth flip-flops for receiving the first and second external commands, and generating the first and second internal commands in response to the clock signal;

first and second latches for latching output signals of the first and second flip-flops, respectively, and outputting the second internal address;

first and second transmission gates positioned in front of the first and second latches, respectively, the first and second transmission gates selectively turned on or off based on an output signal of the fourth flip-flop, to selectively apply output signals of the first and second flip-flops to the first and second latches;

third and fourth latches for latching output signals of the first and second latches, and outputting the first internal address;

an SPA mode start operating unit for receiving the clock signal, an output signal of the fifth flip-flop and an SPA mode signal, and performing a logical operation so as to delay the first internal address by one clock cycle; and third and fourth transmission gates positioned in front of the third and fourth latches, respectively, the third and fourth transmission gates selectively turned on or off based on an output signal of the SPA mode start operating unit, to selectively apply output signals of the first and second latches to the third and fourth latches.

10. The semiconductor memory device of claim 9, wherein the first external address is divided into a first lower address and a first higher address so as to correspond to the first and second clock cycles, respectively, of the clock signal, and the second external address is divided into a second lower address and a second higher address so as to correspond to the third and fourth clock cycles, respectively, of the clock signal.

11. The semiconductor memory device of claim 10, wherein the first flip-flop outputs the first lower address in response to the first clock cycle of the clock signal, the first higher address in response to the second clock cycle of the clock signal, the second lower address in response to the third clock cycle of the clock signal, and the second higher address in response to the fourth clock cycle of the clock signal.

12. The semiconductor memory device of claim 11, wherein the second flip-flop receives the output signal of the first flip-flop, and outputs the first lower address in response to the second clock cycle of the clock signal, and the second lower address in response to the fourth clock cycle of the clock signal.

13. The semiconductor memory device of claim 9, wherein the third flip-flop receives the first external command, and outputs the first internal command to the fourth flip-flop in response to the first clock cycle of the clock signal, and receives the second external command, and outputs the second internal command to the fourth flip-flop in response to the third clock cycle of the clock signal.

14. The semiconductor memory device of claim 9, wherein the fourth flip-flop receives the first internal command output from the third flip-flop, and outputs the first internal command to the fifth flip-flop, the first transmission gate and the second transmission gate in response to the second clock cycle of the clock signal, and receives the second internal command output from the third flip-flop, and outputs the second internal command to the fifth flip-flop, the first transmission gate and the second transmission gate in response to the fourth clock cycle of the clock signal.

15. The semiconductor memory device of claim 9, wherein the fifth flip-flop receives the first internal command output from the fourth flip-flop, and outputs the first internal command to the SPA mode start operating unit in response to the third clock cycle of the clock signal.

16. The semiconductor memory device of claim 9, wherein the first and second transmission gates are controlled and selectively turned on or off based on the first internal command output from the fourth flip-flop in response to the second clock cycle of the clock signal and by the second internal command output from the fourth flip-flop in response to the fourth clock cycle of the clock signal.

17. The semiconductor memory device of claim 9, wherein the third and fourth transmission gates are turned on if an output signal of the SPA mode start operating unit is set to a first logic level, and are turned on if the SPA mode start signal is set to a second logic level.

18. The semiconductor memory device of claim 17, wherein the SPA mode start operating unit outputs the first logic level if the semiconductor memory device is not performed the test operation.

19. The semiconductor memory device of claim 17, wherein the SPA mode start operating unit outputs the second logic level in the second clock cycle of the clock signal, and output the first logic level in the third clock cycle of the clock signal during the test operation.

20. The semiconductor memory device of claim 8, wherein the first external command is an active command, and the second external command is one of a read command and a write command.

21. A method of operating a semiconductor memory device, comprising:
operating an internal address generating circuit in accordance with a first addressing protocol during normal operation; and
operating the internal address generating circuit in accordance with a second addressing protocol during a test operation, the first addressing protocol associated with a first number of clock cycles for transferring a memory address and the second addressing protocol associated with a second number of clock cycles for transferring a memory address, the first number of clock cycles being greater than the second number of clock cycles, wherein operating the internal address generating circuit during the test operation includes
receiving a first external address during first and second clock cycles of a clock signal,
outputting, by the internal address generating circuit, a first internal address and a first internal command in a third clock cycle of the clock signal, the first internal address and the first internal command respectively corresponding to the received first external address and a first external command,
consecutively receiving a second external address after the first external address, and
receiving a second external command two clock cycles from that of the first external command, an interval between the first internal command and a second internal command corresponding to the received second external command being equal to a single clock cycle.

22. The method of claim 21, wherein the first addressing protocol is a double pumped address (DPA) protocol and the second addressing protocol is a single pumped address (SPA) protocol, the DPA protocol allowing memory address transfers during two clock cycles and the SPA protocol allowing memory address transfers during a single clock cycle.

23. A method for achieving an single pumped address (SPA) mode in a semiconductor memory device configured for a double pumped address (DPA) mode, comprising:
receiving a first external address;
generating a first internal address corresponding to the received first external address;
receiving a second external address;
generating a second internal address corresponding to the received second external address; and
delaying the generation of the first internal address to reduce a clock cycle interval between the generated first and second internal addresses, wherein, during the SPA mode, the method further includes
receiving the first external address during first and second clock cycles of a clock signal,
outputting, by an internal address generating circuit, the first internal address and a first internal command in a third clock cycle of the clock signal, the first internal address and the first internal command respectively corresponding to the received first external address and a first external command,
consecutively receiving the second external address after the first external address, and
receiving a second external command two clock cycles from that of the first external command, an interval between the first internal command and a second internal command corresponding to the received second external command being equal to a single clock cycle.

24. The method of claim 23, wherein the second external address is received during third and fourth clock cycles of the clock signal, and the second internal address is generated during the fourth clock cycle of the clock signal.

25. The method of claim 24, wherein, if the delaying step is not performed, the first internal address is generated during the second clock cycle of the clock signal.

* * * * *